United States Patent
Norman et al.

(10) Patent No.: US 6,853,259 B2
(45) Date of Patent: Feb. 8, 2005

(54) RING OSCILLATOR DYNAMIC ADJUSTMENTS FOR AUTO CALIBRATION

(75) Inventors: Robert D Norman, Blaine, WA (US); Dominik J. Schmidt, Palo Alto, CA (US)

(73) Assignee: Gallitzin Allegheny LLC, Los Altos, CA (US)

( * ) Notice: Subject to any disclaimer, the term of this patent is extended or adjusted under 35 U.S.C. 154(b) by 0 days.

(21) Appl. No.: 09/930,822

(22) Filed: Aug. 15, 2001

(65) Prior Publication Data

US 2003/0034848 A1 Feb. 20, 2003

(51) Int. Cl.[7] .................................................. G01J 5/00
(52) U.S. Cl. ........................ 331/66; 331/176; 374/152; 374/163; 374/170; 374/171; 374/185; 374/208
(58) Field of Search ................... 331/66, 176; 374/152, 374/163, 170–171, 185, 208

(56) References Cited

U.S. PATENT DOCUMENTS

| | | | | |
|---|---|---|---|---|
| 3,531,739 A | * | 9/1970 | Groves | 331/116 R |
| 3,719,838 A | * | 3/1973 | Peduto et al. | 310/315 |
| 4,308,492 A | * | 12/1981 | Mori et al. | 322/28 |
| 4,528,505 A | * | 7/1985 | Peterson | 324/765 |
| 4,611,181 A | * | 9/1986 | Fukumura et al. | 331/66 |
| 4,746,879 A | * | 5/1988 | Ma et al. | 331/44 |
| 4,922,212 A | * | 5/1990 | Roberts et al. | 331/176 |
| 5,379,230 A | * | 1/1995 | Morikawa et al. | 702/57 |
| 5,440,520 A | * | 8/1995 | Schutz et al. | 365/226 |
| 5,619,430 A | * | 4/1997 | Nolan et al. | 702/63 |
| 5,739,728 A | | 4/1998 | Kim | |
| 5,801,594 A | * | 9/1998 | Muto et al. | 331/158 |
| 5,805,403 A | * | 9/1998 | Chemla | 361/103 |
| 5,890,100 A | * | 3/1999 | Crayford | 702/130 |
| 5,912,595 A | * | 6/1999 | Ma et al. | 331/117 D |
| 5,956,289 A | * | 9/1999 | Norman et al. | 365/233 |
| 6,002,627 A | * | 12/1999 | Chevallier | 365/212 |
| 6,131,073 A | * | 10/2000 | Honda et al. | 702/107 |
| 6,154,099 A | | 11/2000 | Suzuki et al. | |
| 6,160,755 A | | 12/2000 | Norman et al. | |
| 6,211,744 B1 | | 4/2001 | Shin | |
| 6,442,500 B1 | * | 8/2002 | Kim | 702/132 |
| 6,476,682 B1 | * | 11/2002 | Cole et al. | 331/176 |
| 6,566,900 B2 | * | 5/2003 | Amick et al. | 324/760 |
| 2003/0034851 A1 | * | 2/2003 | Norman et al. | 331/66 |

* cited by examiner

*Primary Examiner*—Michael Tokar
*Assistant Examiner*—Khai Nguyen

(57) ABSTRACT

An apparatus compensates for voltage and temperature variations on an integrated circuit with: a voltage sensor having a digital voltage output; a temperature sensor having a digital temperature output; a register coupled to the voltage sensor and the temperature sensor, the register adapted to concatenate the digital voltage output and the temperature output into an address output; and a memory device having an address input coupled to the address output of the register, the memory device being adapted to store one or more corrective vectors.

20 Claims, 6 Drawing Sheets

Combined V/T with 1 A/D

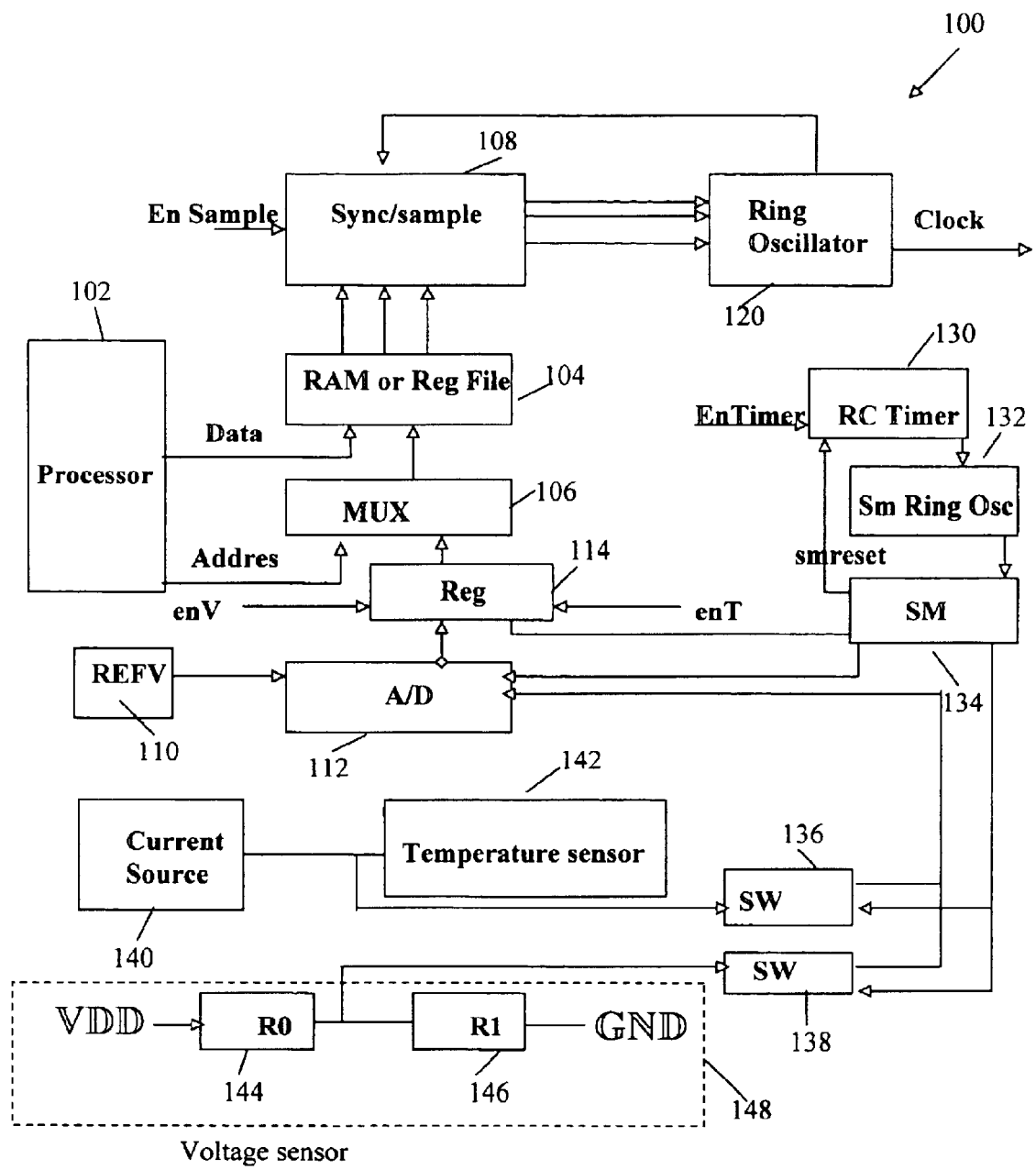
Fig. 1 - Combined V/T with 1 A/D

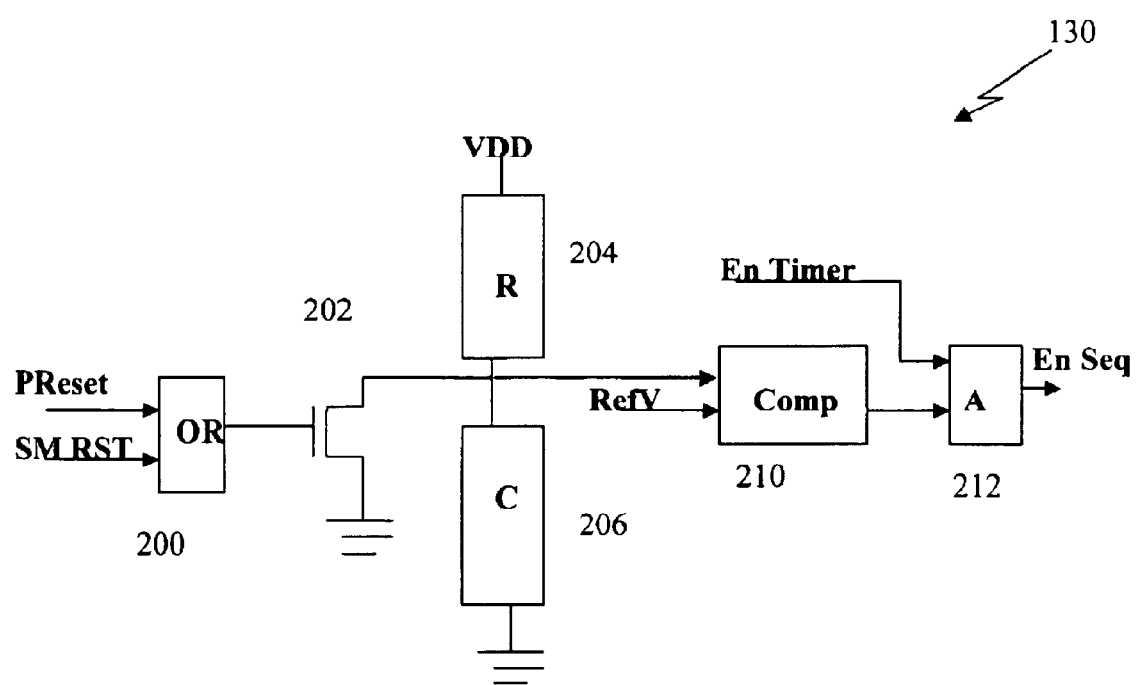
Fig 2 - RC Timer

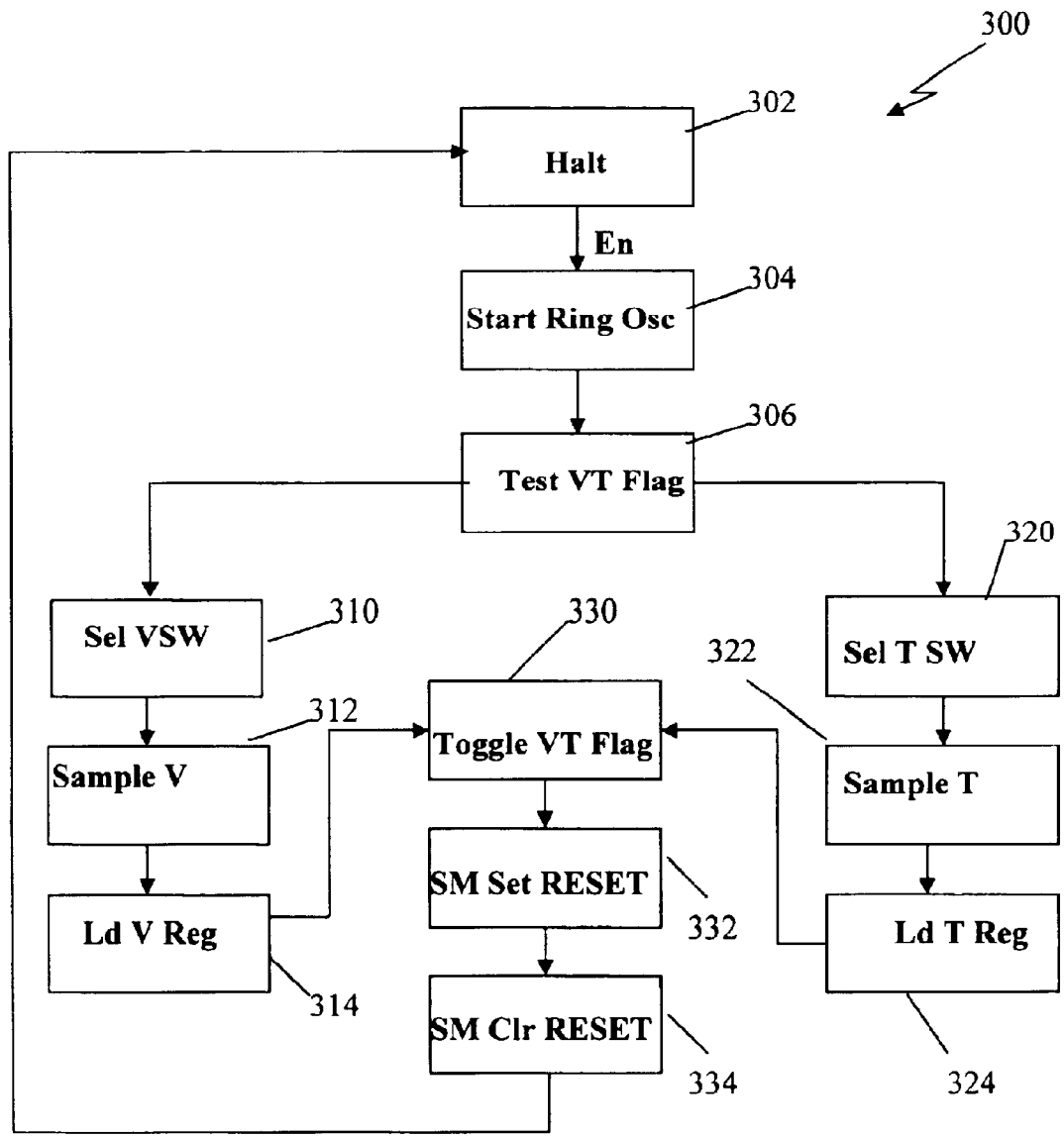
Fig 3 - SM Sequence

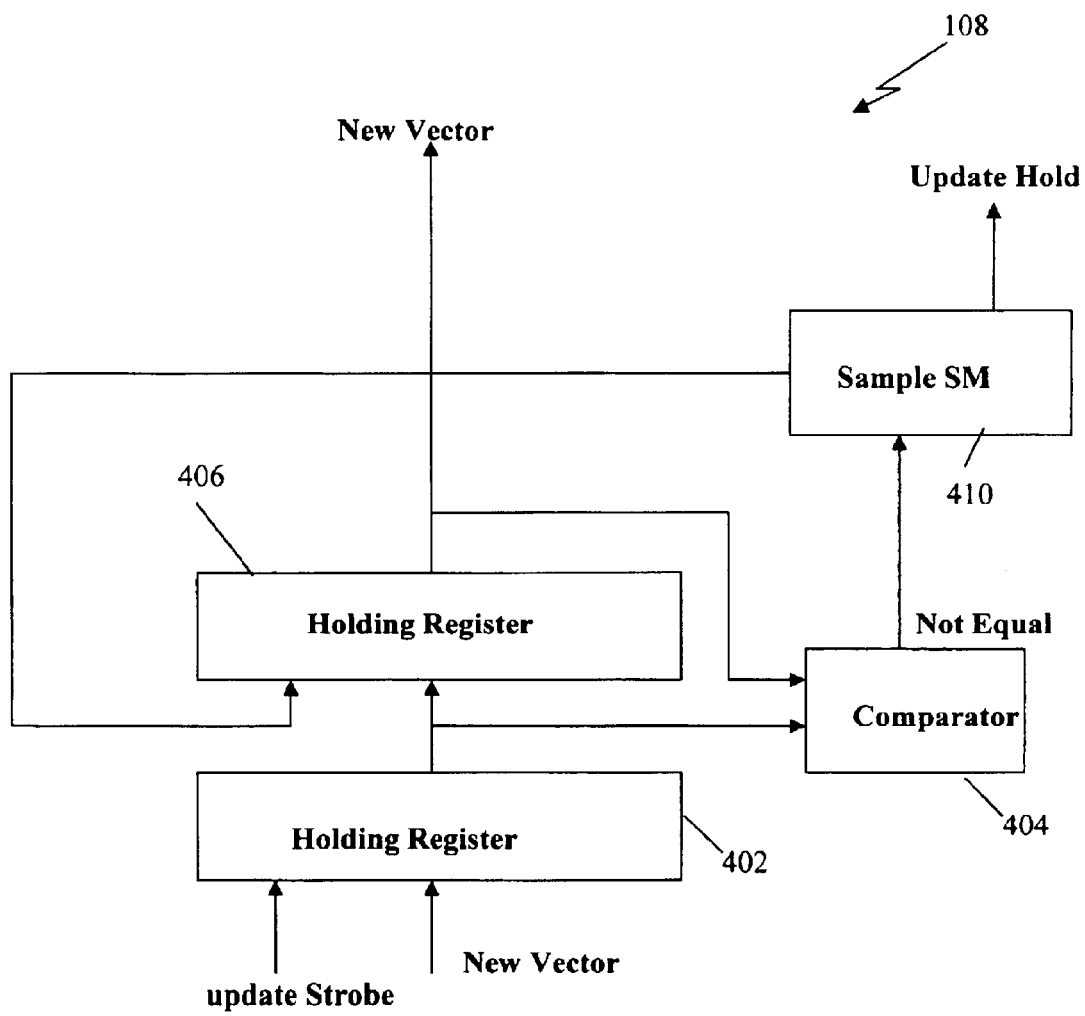
Figure 4 - SYNC/Sample

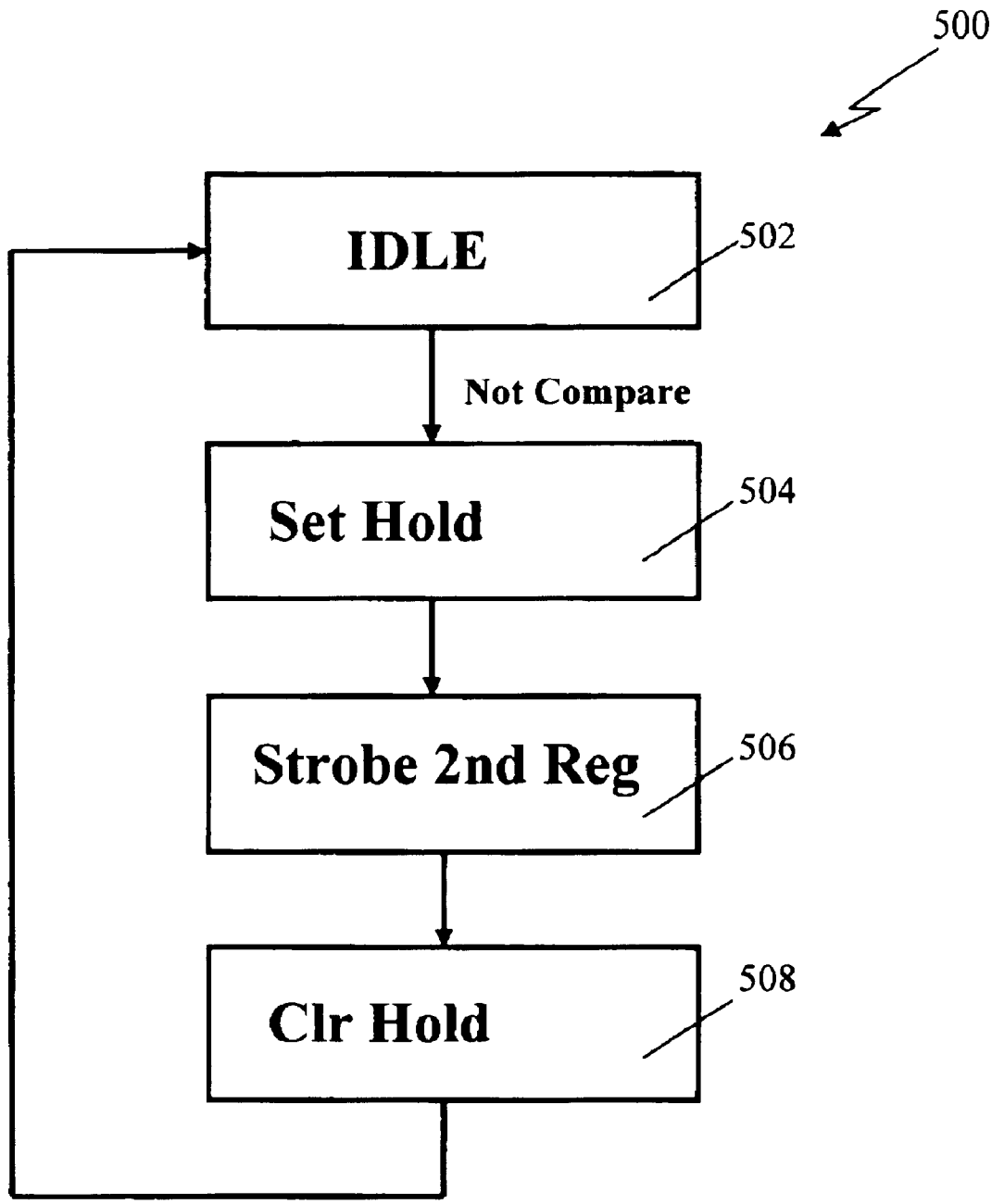
FIG 5 - Sync/Sample Sequence

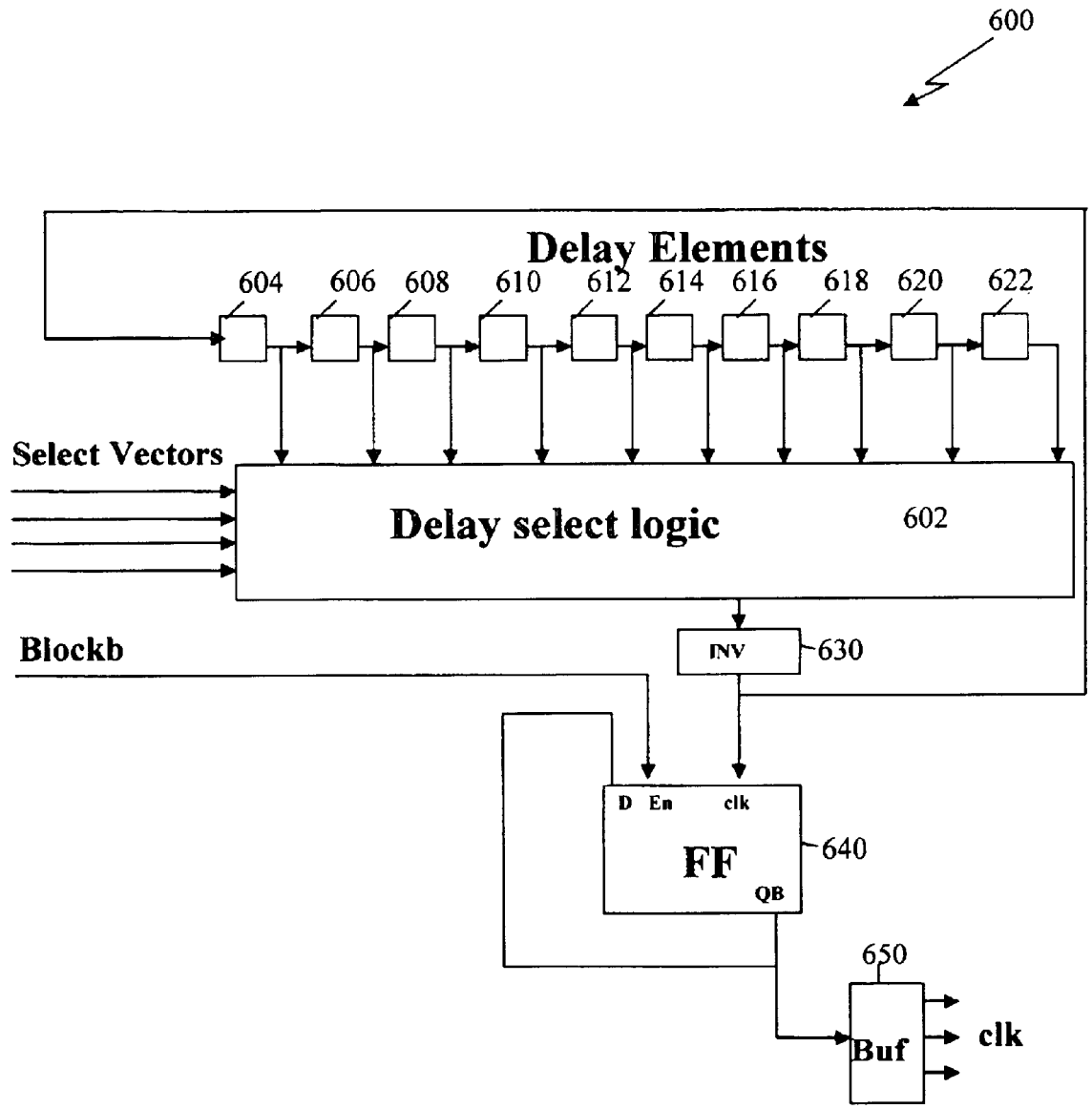
Fig 6 - Adjustable Ring Oscillator

RING OSCILLATOR DYNAMIC ADJUSTMENTS FOR AUTO CALIBRATION

BACKGROUND

The present invention relates to systems and methods using ring oscillators.

To address the ever-increasing need to increase the speed of computers and electronic appliances to process ever increasing amounts of data, designers have increased the clock frequency of a computers central processing unit and/or utilized parallel processing. Many electrical and computer applications and components have critical timing requirements that require clock waveforms that are precisely synchronized with a reference clock waveform.

One type of clock generator is a ring oscillator. Ring oscillators are widely used in electronic equipment such as computers, televisions, videocassette recorders (VCRs) and the like. Typically, a ring oscillator includes a series of discrete components including transistors, capacitors, among others. As discussed in U.S. Pat. No. 6,211,744 to Shin; U.S. Pat. No. 6,154,099 to Suzuki, et al.; and U.S. Pat. No. 6,160,755 to Norman, et al., a conventional ring oscillator can be formed by connecting an odd number of inverters in a ring shape. In such a configuration, if Y is the state (signal level) at a connection point, the Y signal is inverted to Y by the next-stage inverter, and the Y is further inverted to Y by the second next-stage inverter. The signal level is sequentially inverted, and becomes Y at the connection point through one round because an odd number of inverters are connected. Through one more round, the signal level becomes the original Y. In this manner, the ring oscillator self-oscillates. An oscillation output is obtained from the output node of an arbitrary inverter.

Another conventional ring oscillator can use a NAND gate circuit for controlling start/stop of oscillation is inserted in a ring formed by connecting a plurality of even number of inverters. The start/stop of oscillation is controlled by externally inputting a high "H"- or a low "L"-level control signal CNT to the NAND gate circuit. That is, the control signal CNT is first set at "L" level and then changed to "H" level to start oscillation. When the control signal CNT is at "L" level, an output signal from the NAND gate circuit is fixed at "H" level. Outputs from the odd-numbered inverters change to "L" level, outputs from the even-numbered inverters change to "H" level, and the initial states of the output levels of the respective inverters are determined. In this state, the ring oscillator does not oscillate. When the control signal CNT changes to "H" level, the NAND gate circuit substantially operates as an inverter, and the ring oscillator oscillates in the above manner where an odd number of inverters are connected in a ring shape.

The frequency of the oscillation signal from the conventional ring oscillator depends on the number of stages of inverters and a wiring delay. Hence, the lower oscillation frequency is obtained by increasing the number of stages of inverters and the length of the signal line. This increases the circuit size. Further, although the voltage-controlled oscillators have an identical circuit configuration, they have different oscillation frequencies due to certain factors of the production process. For example, the process can affect the gate delay time that can affect the precision of the oscillator.

The gate delay value (gate delay time) per inverter as a constituent unit has conventionally been obtained by measuring the oscillation frequency of a ring oscillator having the above arrangements. Since the constituent unit is a static gate inverter, the gate delay value obtained by measuring the oscillation frequency includes only delay information of the static gate, and delay information of a dynamic gate requiring pre-charge cannot be obtained. Additionally, for a pre-determined combination of stages, a conventional ring oscillator produces a fixed frequency. That is, once assembled, the frequency of the oscillating signal generated by a ring oscillator cannot be adjusted to compensate for temperature or voltage fluctuations.

Many applications in electronics can use simple ring oscillators if the operating characteristics can be made to operate in a tighter range of frequency variation. In an integrated circuit there are 3 major causes of shifts in the operating frequency. They are Process, Temperature and Voltage. Process variations occur during manufacturing, while temperature and voltage variations occur during operation. For example, flash memory systems can use a ring oscillator to provide a flash memory system clock. Large performance variations, however, can be seen by the system as the ring oscillator output varies over process differences, voltage variations and temperature excursions. In most cases the resultant wide range of operating parameter frequencies can adversely affect the speed and/or reliability of the flash memory system.

SUMMARY

In one aspect, an apparatus to compensate for voltage and temperature variations on an integrated circuit includes: a voltage sensor having a digital voltage output; a temperature sensor having a digital temperature output; a register coupled to the voltage sensor and the temperature sensor, the register adapted to concatenate the digital voltage output and the temperature output into an address output; and a memory device having an address input coupled to the address output of the register, the memory device being adapted to store one or more corrective vectors.

Implementations of the above aspect may include one or more of the following. A wake-up oscillator can be provided, where the wake-up oscillator periodically enables the memory device to output a corrective vector. The wake-up oscillator is a low-power oscillator, such as a resistor-capacitor (RC) oscillator. Adjustment values are written into the memory device during initialization, based on testing parameters. A ring oscillator can be connected to the output of the memory device. The memory device can generate an adjustment vector based on the current voltage and temperature and wherein the adjustment vector is applied to the ring oscillator. The adjustment vector selects the ring frequency; lengthening or shortening the ring delay to maintain the desired operating point. The adjustment vectors are determined by chip testing and characterization. The apparatus can include a processor; and a multiplexor having an input coupled to the processor and a second input coupled to the register and an output coupled to the memory device, the multiplexor allowing the processor to download the adjustment vectors into the memory device.

In another aspect, a method for dynamically adjusting for temperature and voltage variations on an integrated circuit includes periodically sensing the voltage and temperature values; and dynamically making adjustments in clock frequency based on the voltage and temperature values.

Implementations of the method may include one or more of the following. The method includes combining the voltage and temperature values into a digital word. The method can store the temperature value in a first register; the voltage value in a second register; and merge the first and second registers to represent a concatenated address. The concatenated address can be applied to the address of a memory to retrieve a corrective value from a corrective table. The corrective table can be generated by characterizing the integrated circuit. The characterization includes varying the voltage and temperature over a predetermined range. The method includes applying a corrective vector to a ring oscillator. The periodic sensing can include receiving a wake-up signal from a low power wake-up oscillator to perform the calibration.

Advantages of the invention include one or more of the following. The system addresses major causes of frequency variation in a ring oscillator design: process, voltage, and temperature variations. Process variation can be reduced by allowing for skew adjustment calibration during manufacturing. This adjustment eliminates the majority of timing variations in the oscillator due to the process differences. The adjustments narrow the frequency range and allow for a much tighter range of operation. The system also allows for dynamic adjustments for temperature and voltage variations. These adjustments are accomplished by sensing the voltage and temperature values and dynamically making adjustments in clock frequency. The system can dynamically adjust for variations by having dedicated hardware for automatically sensing the varied parameters and adjust them as they occur. This sensing is activated by an RC timer that can have its sampling period adjusted to meet the anticipated needs of the environment. This method will allow a dormant system the ability to wake from sleep, calibrate and go back to sleep, in contrast to other approaches require the system to become active before calibration is done. This will introduce latencies, depending on the methodology used.

DESCRIPTION

FIG. 1 shows an exemplary auto-calibration system 100 with combined voltage and temperature detectors. A processor 102 has address and data lines. The data lines of the processor 102 drives the upper address line inputs of a memory or register file 104. The address lines of the processor 102 is provided to one input of a multiplexor 106. The second input of the multiplexor 106 is connected to the output of a register 114. The register 114 can be enabled by a voltage enable (enV) signal or a temperature enable (enT) signal. The register 114 in turn receives the output of an analog to digital converter (ADC) 112. The ADC 112 receives a reference voltage from a source 110. The ADC 112 also receives control signals from a state machine 134 as well as switches 136 and 138. The state machine 134 also controls the switches 136 and 138. The switch 136 is connected to a current source 140 and to a temperature sensor 142. The switch 138 in turn is connected to a voltage divider having a first resistor 144 and a second resistor 146 in series between voltage and ground. The state machine 134 in turn is driven by a resistor-capacitor (RC) timer 130 and a small ring oscillator 132. The RC oscillator 130 receives a timer enable (EnTimer) signal from a master controller or the processor block 102 (not shown). The state machine 134 generates a reset signal that is provided to the RC timer 130, and the RC timer 130 is used to clock the small ring oscillator 132.

The output of the memory or register file 104 drives a sync/sample module 108, which in turn drives a ring oscillator 120. The ring oscillator 120 generates a system clock and a control signal that is provided to the sync/sample module 108. More details on the sync/sample module 108 and the ring oscillator 120 are shown below.

The dynamic operation of the ring oscillator 120 is discussed next. The circuit of FIG. 1 can adjust frequency drift, due to temperature and voltage variations. As the temperature and voltage of the system changes, the operating characteristics of the circuits will speed up at lower temperatures, and slow down at higher temperatures. To adjust for this change and keep the system running at the ideal frequency, the temperature and voltage of the system needs to be monitored. The current source 140 is applied to the temperature sensor 142, which can be any device that changes value with changes in temperature. The simplest temperature sensor 142 that could be used is a resistor. The current source 140 is applied to the temperature sensor 142 to get a voltage based on the impedance of the device. As the temperature changes the impedance also changes, causing the voltage of the connection node to increase and decrease. This voltage indicating temperature value and changes is applied to the ADC 112. The value applied is translated to a digital value, which represents a temperature vector. The output of the ADC 112 is registered and applied to the multiplexor 106, the other side being driven by an address from the processor 102. The output of the multiplexor 106 is applied to the memory 104 as the address input. At initialization time the multiplexor source is the processor 102. At initialization, the processor 102 writes adjustment values into the RAM or Register File 104. After these values are stored in the RAM 104 the multiplexor source is switched, allowing the temperature vectors to be applied to the RAM 104 as the address. The output of the RAM 104 now acts as the adjustment vector that is applied to the ring oscillator 120. This value applied selects the ring frequency; lengthening or shortening the ring delay to maintain the desired operating point. The adjustment vectors are determined by chip testing and characterization.

The circuit of FIG. 1 compensates for changes in voltage as follows. The system voltage in question can be applied to a voltage divider formed by resistors 144 and 146 that is input to the ADC 112. As the voltage changes the input to the ADC 112 will change and the resultant output of the ADC 112 is applied to the memory 104. This value is an address used to produce a table compensation vector that will be applied to the oscillator circuit 120 in the same manner as described above for temperature compensation. Like the temperature circuit the vector loaded in memory 104 is done at initialization time by the processor from data taken by testing and characterization.

To be able to adjust for voltage and temperature change at the same time, the two sensing methods are combined in FIG. 1. The temperature and voltage inputs to the A/D are switched to give an alternate readout of the A/D. When the Temperature is sampled by the A/D its value is stored in a register. Likewise, when the voltage is sampled by the A/D its value is stored in a holding register. The two register values are combined to represent a concatenated address applied to the look-up table RAM or register File. While this method can be made to work, the value of the temperature-compensating sensor becomes critical. A negative coefficient needs to be produced so that an increase in temperature will bias the design such that the oscillator will speed up or when temperature decreases the oscillator will be vectored to slow down. If this is not done the temperature and voltage components will add in the wrong direction giving the wrong results. To build the RAM vector table, extensive characterization must be done, by varying the voltage and temperature to produce a meaningful table.

Process variations can be dialed out based on the correction table vector loaded. The table should produce a desired center frequency that operates as close as possible to the desired frequency when operating at nominal temperature and voltage. To assure the table values are correct; means for testing the oscillator and adjusting it to dial in the desired frequency need to be assured. This can be done by outputting the clock to the outside for monitoring with test equipment or in injecting a wide pulse that allows a counter to count with the oscillator. The count reached from this enable pulse will be a direct correlation to the operating frequency. This count can be used by the processor in setting the proper vectors, for the starting point from which voltage and temperature can be adjusted.

Referring now to FIG. 2, details of one implementation of an RC timer 130 is shown. The timer 130 has an OR-gate 200 that receives a Power-on reset signal and a state machine reset signal. The output of the OR gate 200 is connected to an FET transistor 202 and, during reset, the OR gate 200 clamps the output of the transistor 202 to ground. The output of the transistor 202 is connected to a resistor-capacitor network having a resistor 204 connected in series with a capacitor 206. The junction between the resistor-capacitor network drives a comparator 210 which compares the RC signal with a predetermined reference voltage RefV. The output of the comparator 210 is provided to a gate 212. The gate 212 also receives a timer enable (EnTimer) signal. The output of the gate 212 is a sequence enable (EnSeq) signal.

FIG. 2 shows on method for implementing a "Dead Man" timer. In this circuit an RC time constant charges up until the voltage value going to the Comparator reaches the trip point. When the trip point is reached the EnSeq signal is activated, provided the processor has enabled the timer with the setting of the enable timer register. When this signal becomes active it starts a Ring Oscillator that is used to run a state machine. This state machine is used to sample the Voltage and Temperature readings and load the resultant values in the holding register. FIG. 3 shows a flow chart for a typical state machines functional operation. In this example only one vector, voltage or temperature is updated on a timer time out. As these parameters tend to be slow in changing only limited updating is done to meet the desired adjustment requirements. If faster changes in temperature or voltage are anticipated, then the state machine may be altered to provide both vectors being updated in a sample cycle. At the end of the State Machines update sequence the State machine will set a register that drives the State Machine Reset (SMReset) signal. This signal will drive the RC timer to its Reset state, arming it to go to its low voltage start state. After the signal has been applied for sufficient time, allowing for discharge, the SMReset signal is removed. When this is done the State Machine goes to its Halt, sleep state and the timer begins timing toward its trigger state, where the sequence will repeat.

FIG. 3 illustrates an exemplary state machine sequence 300. In this sequence, all devices are in a halt state (step 302). Upon receipt of the EnSeq signal, the ring oscillator 120 is started (step 304). The process 300 then checks a voltage/temperature (VT) flag (step 306). If the flag indicates that voltage is to be calibrated, the process 300 selects the voltage switch (step 310). The sample voltage input is taken (step 312), and the result is stored in a voltage register (step 314). Correspondingly, if the temperature has been selected, the process selects the temperature switch (step 320). The sample temperature input is taken (step 312), and the result is stored in a temperature register (step 314). From either step 314 or 324, the VT flag is toggled (step 330). Next, the state machine 134 sets a reset signal (step 332) and then clears the reset signal (step 334) before looping back to the halt state in step 302.

FIG. 4 shows an exemplary sync/sample module 108. A holding register 402 stores a new vector when an update strobe is asserted. The output of the holding register 402 is provided to a comparator 404 and a holding register 406. The comparator 404 also receives the output of the holding register 406. The comparator 404 compares the output of the holding registers 402 and 406, and if not equal, enables a sample state machine 410. The sample state machine 410 generates an update hold signal and an update strobe for the holding register 406. The output of the holding register 406 is a new vector.

Whenever a calibration sequence occurs the output of the memory may change in value or remain the same. Whenever this sequence occurs the Sync/Sample has the job of determining if there is a new value or the same value exists. If the same value exists the block and SM does nothing. If there is a new vector the state machine will be activated by the "not Compare" signal generated by comparing the old vector and the new vector. When this signal becomes active the state machine starts its sequence.

FIG. 5 illustrates an exemplary sync/sample sequence 500. The sequence 500 is initially in an idle condition (step 502). The sequence 500 sets a hold signal (step 504) and strobes a second register (step 506). The sequence 500 then clears the hold signal (step 508) before looping back to the idle condition.

In FIG. 5, the SM puts up a Hold signal that puts a hold on the output stage of the Ring Oscillator. The state machine then waits a few clocks to assure this has occurred and the strobes the second stage holding register to transfer the first and new vector into the second stage. When this new vector is loaded the output will then drive the input to the ring oscillator, which will cause the Ring Oscillator to select the delay value represented, by the new input select. As the new value is loaded the SM will see the not compare input change to a new value as they now compare. The SM will then drop the Hold signal, as the Ring Oscillator should have switched to the new value and should be stable. The dropping of the hold will allow the output stage to continue oscillating. It should be noted that any application that may have problems do to a stretched clock, because to do calibration it may require the temporary turning off of the calibration sequence until such timing changes will not cause problems. It is anticipated that such clock stretching will not cause problems in most applications as the clock will not glitch, but will just have a short temporary pause in the clock cycle.

The Selection Vector picks which delay element will be used for the clock period and feedback element. The feedback value is inverted and fed to the delay input. The same vale is used to clock a flip-flop, which in turn drives a divide by 2 signal to produce the system clock used to run the system. The flip-flop is used to produce a 50% duty cycle clock and produce a better (square) shaped signal. The Holdb signal is used to temporarily halt the FF from toggling while the delay elements are switched. This halt is required to prevent the clock from glitching as the delay path is switched FIG. 6 shows one embodiment of an adjustable ring oscillator 600. The oscillator 600 has a delay select logic 602, which receives outputs from delay elements 604, 606, 608, 610, 612, 614, 616, 618, 620 and 622. The delay select logic 602 in turn drives an inverter 630. The output of the inverter 630 is provided as an input to the delay element 604. The output of the inverter 630 is also used to clock a flip-flop 640. The output of the flip-flop 640 is looped back to the D-input of the flip-flop 640. The output of the flip-flop 640 is also provided to a buffer 650 that provides a plurality of clock signals, each of which can be used to clock a portion of the chip to prevent clock degradation due to too much load on the chip.

In the above description a RAM was used to load the correction vectors to be applied. If the process is stable then the RAM may be substituted for a ROM for cost reduction. If this method is selected some potential adjustments for process may be lost but a more cost effective solution would be possible. In such a system the processor would not be required to load the RAM so the muxing of the processor and A/D would not be required. The Voltage/Temperature compensation would then run totally independent of the processor, except for enables/disables a designer may still which to invoke.

What is claimed is:

1. An apparatus to compensate for voltage and temperature variations on an integrated circuit, comprising:
    a voltage sensor having a digital voltage output;
    a temperature sensor having a digital temperature output;
    a register coupled to the voltage sensor and the temperature sensor, the register adapted to concatenate the digital voltage output and the temperature output into an address output; and
    a memory device having an address input coupled to the address output of the register, the memory device being adapted to store one or more corrective vectors.

2. The apparatus of claim 1, further comprising a wake-up oscillator coupled to the memory device, the wake-up oscillator periodically enables the memory device to output a corrective vector.

3. The apparatus of claim 2, wherein the wake-up oscillator is a low-power oscillator.

4. The apparatus of claim 2, wherein the wake-up oscillator is a resistor-capacitor (RC) oscillator.

5. The apparatus of claim 1, wherein adjustment values are written into the memory during initialization.

6. The apparatus of claim 1, further comprising a ring oscillator coupled to the output of the memory device.

7. The apparatus of claim 6, wherein the memory device generates an adjustment vector based on the current voltage and temperature and wherein the adjustment vector is applied to the ring oscillator.

8. The apparatus of claim 7, wherein the adjustment vector selects the ring frequency; lengthening or shortening the ring delay to maintain the desired operating point.

9. The apparatus of claim 7, wherein the adjustment vectors are determined by chip testing and characterization.

10. The apparatus of claim 7, further comprising:
    a. a processor;
    b. a multiplexor having an input coupled to the processor and a second input coupled to the register and an output coupled to the memory device, the multiplexor allowing the processor to download the adjustment vectors into the memory device.

11. A method for dynamically adjusting for temperature and voltage variations on an integrated circuit, comprising:
    periodically sensing the voltage and temperature values;
    concatenating the voltage and the temperature values into an address output;
    applying the address output to a memory device, the memory device being adapted to store one or more corrective vectors; and
    dynamically making adjustments in clock frequency based on the voltage and temperature values.

12. The method of claim 11, further comprising combining the voltage and temperature values into a digital word.

13. The method of claim 12, further comprising storing the temperature value in a first register.

14. The method of claim 13, further comprising storing the voltage value in a second register.

15. The method of claim 14, further comprising merging the first and second registers to represent a concatenated address.

16. The method of claim 15, further comprising applying the concatenated address to the address of a memory to retrieve a corrective value from a corrective table.

17. The method of claim 16, further comprising generating the corrective table by characterizing the integrated circuit.

18. The method of claim 17, wherein the characterizing step further comprises varying the voltage and temperature over a predetermined range.

19. The method of claim 11, further comprising applying a corrective vector to a ring oscillator.

20. The method of claim 11, wherein the periodic sensing further comprises receiving a wake-up signal from a low power wake-up oscillator to perform the calibration.

* * * * *